(12) United States Patent
Niayesh et al.

(10) Patent No.: US 8,154,311 B2
(45) Date of Patent: Apr. 10, 2012

(54) METHOD AND DEVICE FOR CHARACTERIZING THE LINEAR PROPERTIES OF AN ELECTRICAL COMPONENT

(75) Inventors: Kaveh Niayesh, Teheran (IR); Matthias Berth, Zürich (CH); Andreas Dahlquist, Zürich (CH); Christoph Heitz, Elgg/ZH (CH); Martin Tiberg, Genève (CH)

(73) Assignee: ABB Research Ltd, Zurich (CH)

( * ) Notice: Subject to any disclaimer, the term of this patent is extended or adjusted under 35 U.S.C. 154(b) by 101 days.

(21) Appl. No.: 11/826,795

(22) Filed: Jul. 18, 2007

(65) Prior Publication Data

US 2007/0285109 A1    Dec. 13, 2007

Related U.S. Application Data

(63) Continuation of application No. PCT/CH2006/000037, filed on Jan. 17, 2006.

(30) Foreign Application Priority Data

Jan. 21, 2005    (EP) .................................... 05405031

(51) Int. Cl.
*G01R 27/08* (2006.01)
(52) U.S. Cl. ........................ 324/713; 324/707
(58) Field of Classification Search .................. 324/713, 324/600
See application file for complete search history.

(56) References Cited

U.S. PATENT DOCUMENTS

| | | | |
|---|---|---|---|
| 4,156,842 A | | 5/1979 | Brooks et al. |
| 4,300,182 A | * | 11/1981 | Schweitzer, III ............... 361/79 |
| 5,396,172 A | | 3/1995 | Lat et al. |
| 5,502,392 A | * | 3/1996 | Arjavalingam et al. ....... 324/638 |
| 5,517,422 A | * | 5/1996 | Ilic et al. ......................... 700/286 |
| 6,011,345 A | * | 1/2000 | Murray et al. .................. 310/321 |
| 6,035,265 A | | 3/2000 | Dister et al. |
| 6,054,867 A | * | 4/2000 | Wakamatsu ................... 324/650 |
| 2002/0011848 A1 | | 1/2002 | Coffeen |
| 2004/0164745 A1 | | 8/2004 | Ryder |

FOREIGN PATENT DOCUMENTS

| | | |
|---|---|---|
| EP | 0 443 835 A2 | 8/1991 |
| GB | 2 411 733 A | 9/2005 |
| WO | WO 01/84169 A1 | 11/2001 |

OTHER PUBLICATIONS

Gere et al., Matrix Algebra for Engineers, Van Nostrand Co., 1965, p. 109-117.*
Eigen Vectors Eigen Values, Determinants, web archive, Oct. 20, 2004, p. 1-3.*

(Continued)

*Primary Examiner* — Thomas Valone
(74) *Attorney, Agent, or Firm* — Buchanan Ingersoll & Rooney PC

(57) ABSTRACT

A method and device for determining the linear response of an electrical multi-port component has an "estimation procedure" in which an estimated admittance matrix is determined by applying voltages to the ports of the component and measuring the response of the component. The estimation procedure can e.g. consist of a conventional measurement of the admittance matrix. The method further has a "measurement procedure" in which several voltage patterns are applied to the port. The voltage patterns correspond to the eigenvectors of the estimated admittance matrix. For each applied voltage pattern, the response of the component is measured. This allows to measure the linear response of the component accurately even if the eigenvalues of the admittance matrix differ by several orders of magnitude.

20 Claims, 2 Drawing Sheets

OTHER PUBLICATIONS

Matrix and Linear Algebra package for Excel, MSU course notes, Jan.-Jul. 2004, p. 1-4.*

Williams, Dylan, Multiconductor transmission-line characterization: representation, approximations, and accuracy, IEEE Trans. on Microwave Theory and Tech., V. 47, No. 4, Apr. 1999, p. 403-409.*

Tiberg, Martin, WO 2007140627, A method for determining the linear electrical response of a transformer, generator or electrical motor, p. 1-31.*

Keyhani, A. et al. "Identification of High-Order Synchronous Generator Models from SSFR Test Data," IEEE Transactions on Energy Conversion, vol. 9, No. 3, Sep. 1994, pp. 593-603.

International Search Report mailed Mar. 3, 2007 in International Application No. PCT/CH2006/00303 corresponding to copending U.S. Appl. No. 12/328,408.

Written Opinion mailed Mar. 3, 2007 in International Application No. PCT/CH2006/00303 corresponding to copending U.S. Appl. No. 12/328,408.

International Preliminary Report on Patentability mailed Sep. 19, 2008 in International Application No. PCT/CH2006/00303 corresponding to copending U.S. Appl. No. 12/328,408.

Agilent Technologies: "Agilent 4155C/4156C Semiconductor Parameter Analyzer User's Guide, Edition 1", Agilent Manuals, vol. 1, Jan. 2001, pp. 1.1-1.20, 2.41-2.46, 4.39, 4.41, 7.19-7.25.

SI. Fang: "Electrical Modeling on Main Injector Dipole Magnets", Mar. 17, 1995, Fermi National Accelerator Laboratory, pp. 1-7.

Guillaume P. et al., "Parametic identification of two-port models in the frequent domain" Instrumentation and Measurement Technology Conference, Atlanta, May 14, 1991, vol. Conf. 8, pp. 263-271.

Schlagenhaufor F. et al., "Using N-port models for the analysis of radiating structures", 2002 IEEE International Symposium on Electromagnetic Compatibility. EMC. Symposium Record. Minneapolis, MN, Aug. 19-23, 2002, International Symposium on Electromagnetic Compatibility, New York, NY, Aug. 19, 2002, vol. 1 of 2, pp. 297-302.

PCT/ISA/210, Mar. 28, 2006.
EPO Form 1507, Jul. 14, 2005.
PCT/IPEA/409, Dec. 20, 2006.

* cited by examiner

US 8,154,311 B2

METHOD AND DEVICE FOR CHARACTERIZING THE LINEAR PROPERTIES OF AN ELECTRICAL COMPONENT

RELATED APPLICATIONS

This application claims priority under 35 U.S.C. §119 to EP Application 05405031.5 filed in Europe on Jan. 21, 2005, and as a continuation application under 35 U.S.C. §120 to PCT/CH2006/000037 filed as an International Application on Jan. 17, 2006, designating the U.S., the entire contents of which are hereby incorporated by reference in their entireties.

TECHNICAL FIELD

The invention relates to a method and a device for characterizing the linear properties of an electrical multi-port component. It also relates to a method for modeling an electrical system with at least one component characterized in this manner.

BACKGROUND INFORMATION

The linear properties of electrical components with multiple ports are generally characterized by one of the characteristics matrices, e.g. the impedance or transmittance matrix. These matrices can be measured using suitable circuitry.

In general, all elements of the characteristics matrices are frequency dependent, and therefore the measurements must be carried out for different frequencies.

It has been found that conventional methods of measurement may provide poor results because limited precision of the measurement devices and electric noise, in particular if different elements or eigenvalues of the characteristics matrices strongly differ in magnitude. In these cases, information may be lost. On the other hand, the interactions between different electrical components or subsystems in a system can only be described precisely if the properties of the characteristics matrices are well known.

The invention relates to the closest state of the art as shown in the article by Si. Fang, "Electrical modeling of main injector dipole magnets", Fermi National Accelerator Laboratory (Mar. 17, 1995). Fang discloses a device for characterizing the linear properties of a five-port electrical component, which in this case is a dipole magnet. The device has voltage sources and current sensing units for electrical measurement of the admittance matrix elements as a function of frequency.

In the User's Guide by Agilent Technologies, "Agilent 4155C/4156C Semiconductor Parameter Analyzer", Volume 1, General Information, Agilent Part No. 04156-90010, Edition 1 (January 2001), a device for characterizing the linear properties of an electrical component with several ports is disclosed. The device has dc or pulsed voltage sources, current monitoring units and a remote control unit for automated measurement. The device performs both measurement and analysis of measurement results.

U.S. Pat. No. 4,156,842 A discloses a system for characterizing the linear properties of an electrical network having at least one port. The device uses high-frequency signal generators and voltage and current sensing units for automated measurement.

In the article of P. Guillaume et al., "Parametric Identification of Two-Port Models in the Frequency Domain", IEEE Instrumentation and Measurement Technology Conference, p.263-271, Vol. Conf. 8, Atlanta (May 14, 1991), a method and device for characterizing linear two-ports is disclosed.

The input and output voltages and currents are measured simultaneously in the frequency band of interest. An analysis of the measurement data is presented that takes care of noise and calibration errors in the input-output data.

In the cited state of the art a single measurement procedure is performed and refined analysis methods are disclosed for improved estimation of the linear properties of the electrical system.

SUMMARY

Hence, the problem to be solved by the present invention is to provide an improved method and device for characterizing the linear properties of an electrical multi-port component. This problem is solved by the method and device according to the independent claims.

Accordingly, the method for characterizing a component having n>1 ports contains an "estimation procedure" in which an estimated admittance matrix Y' is determined by applying voltages to the ports of the component and measuring the response of the component. The estimation procedure can e.g. consist of a conventional measurement of the admittance matrix Y' by applying a voltage to one port, grounding all other ports, measuring the current at each port, and repeating this procedure for all ports.

The method further comprises a "measurement procedure" in which several voltage patterns $u_k$ are applied to the port. The voltage patterns correspond to the eigenvectors $v_k$ of the estimated admittance matrix Y', wherein "correspond" is to express that the pattern $u_k$ is substantially (but not necessarily exactly) parallel, i.e. proportional, to the (normalized) eigenvector $v_k$ and its corresponding eigenvalue $\lambda_k$. For each applied voltage pattern $u_k$, the response of the component is measured.

As it has been found, applying voltage patterns $u_k$ corresponding to the eigenvectors of the admittance matrix allows for obtaining a more accurate description of the component, even if the eigenvalues of the admittance matrix differ substantially from each other.

The response of the device is advantageously measured by measuring, for each applied voltage pattern $u_k$, the current pattern $i_k$ at the ports.

The device according to the invention is able to carry out this type of measurement automatically on a device having n>1 ports.

In another aspect, the invention is directed to a device that is able to automatically determine the linear response of a component having n>2 ports by means of n voltage generators for generating a voltage for each port, and n current sensors for sensing the current at each port, using the method described here.

Note: Throughout this text, bold face upper case letters, such as Y, are used to denote matrices, bold face lower case letters, such as u or $u_k$, are used to denote vectors, and non-bold letters, such as $\lambda_k$, are used to denote scalars or components of matrices or vectors.

When talking about "linear properties" of the component, this term is to be understood as encompassing any property that is exactly or close to linear as long as the property fulfills the mathematical relations outlined below with sufficient accuracy within the range of currents and voltages of interest.

BRIEF DESCRIPTION OF THE DRAWINGS

Further embodiments, advantages and applications of the invention are given in the dependent claims as well as in the now following detailed description with reference to the figures:

DETAILED DESCRIPTION

Figure 1:
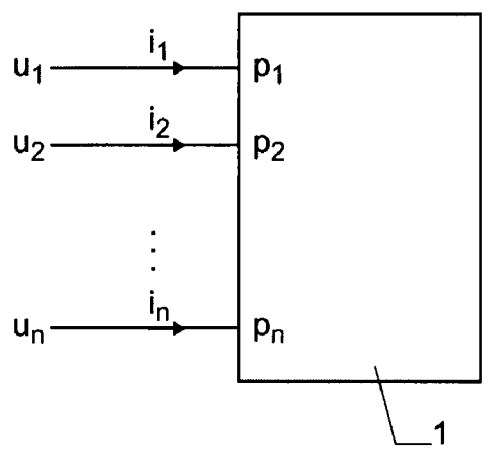
FIG. 1 is a schematic illustration of a component to be characterized.

General Measurement Principle:

FIG. 1 shows a multi-port component 1 having n>1 ports $p_1$ through $p_n$. When linear voltages $u_1$ through $u_n$ are applied to the ports $p_1$ through $p_n$, currents $i_1$ through $i_n$ will flow. The linear electrical response of component 1 are characterized by its admittance matrix Y or, equivalently, by its impedance matrix. In admittance notation, applying the voltage vector $u=(u_1 \ldots u_n)$ of voltages at the ports $p_1$ through $p_n$ generates a current vector $i=(i_1 \ldots i_n)$ as follows:

$$i = Y \cdot u. \quad (1)$$

The general principle of measurement according to the present invention is based on an estimation procedure and a measurement procedure. In the estimation procedure, an estimated admittance matrix Y' is determined, in the measurement procedure a more accurate measurement is carried out.

In the estimation procedure, the elements of the estimated admittance matrix Y' can e.g. be measured directly using conventional methods. The diagonal elements $Y'_{ii}$ can e.g. by measured by applying a voltage $u_i$ to port $p_i$ and measure the current $i_i$ at the same port while all other ports are short-circuited to zero volt, i.e. $Y'_{ii}=i_i/u_i$ while $u_j=0$ for $i \neq j$. The other elements $Y'_{ij}$ of the matrix can be measured by applying a voltage $u_i$ at port $p_i$ while setting all other ports to zero volt and measuring the current $i_j$ at port $p_j$, $Y'_{ij}=i_j/u_i$ while $u_j=0$ for $i \neq j$.

Other conventional methods for measuring the estimated impedance matrix Y' in the estimation procedure can be used as well.

In general, the estimated admittance matrix Y' has n eigenvalues $\lambda_1 \ldots \lambda_n$ and n corresponding (normalized) eigenvectors $v_1 \ldots v_n$ for which $$Y' \cdot v_k = \lambda_k \cdot v_k. \quad (2)$$

Once the estimated admittance matrix is known, its eigenvectors $v_k$ can be calculated.

In a measurement procedure following the estimation procedure, several (in general n) voltage patterns $u_k=(u_{1k} \ldots u_{nk})$ are applied to ports $p_1 \ldots p_n$ of component 1. Each voltage pattern $u_k$ corresponds to one of the eigenvectors $v_k$. For each applied voltage pattern $u_k$, a response of the component is measured, in particular by measuring the induced current pattern $i_k$.

As mentioned above, voltage pattern $u_k$ corresponds to (normalized) eigenvector $v_k$ (which is one of the n normalized eigenvectors of the admittance matrix), namely in the sense that the voltage pattern $u_k$ is substantially parallel, i.e. proportional, to the eigenvector $v_k$ corresponding to eigenvalue $\lambda_k$. Theoretically, using $u_k \propto v_k$ would be the best solution, but a device generating the voltage patterns $u_k$ will, in general, not be able to generate voltage patterns matching the eigenvectors exactly due to discretization errors. Methods for handling devices with limited resolution for generating the voltage patterns will be addressed below.

Once the measurement procedure is complete, the voltage patterns $u_k$ and the corresponding current patterns $i_k$ fully characterize the linear response of component 1.

In general, the admittance matrix Y is frequency dependent. For fully modeling the behavior of component 1 in a network, the linear response of component 1 should be known for an extended frequency range, e.g. from 50 Hz to several MHz. For this reason, the estimation procedure is carried out at a plurality of frequencies $\omega_i$ in the given range.

Advantageously, for each estimation procedure, the eigenvalues $\lambda_k(\omega_i)$ at the given frequency $\omega_i$ are calculated. Then, the most critical frequencies are determined, which are those frequencies where the eigenvalues reach a local maximum or minimum or, in particular, where the absolute ratio between the largest and smallest eigenvalue has a maximum or exceeds a given threshold. These critical frequencies are of particular interest, either because they are indicative of a resonance of component 1 or because they show that some of the estimated eigenvalues may be of poor accuracy and the described measurement procedure is required to increase the accuracy.

It is principally possible to divide the desired frequency range in a number of frequency windows and to calculate the most critical frequencies in each frequency window.

For each or at least some of the critical frequencies, the measurement procedure described above is carried out to refine the measurement. In addition or alternatively thereto, the measurement procedure can be carried out at other points within the frequency range of interest.

The frequencies $\omega_i$ where measurements are carried out can be distributed linearly or logarithmically over the range of frequencies of interest. In an advantageous embodiment, though, the density of measurement frequencies $\omega_i$ close to the critical frequencies as mentioned above is larger than the density of measurement frequencies $\omega_i$ in spectral regions far away from the critical frequencies. This allows to obtain a more reliable characterization of the component.

Figure 2:
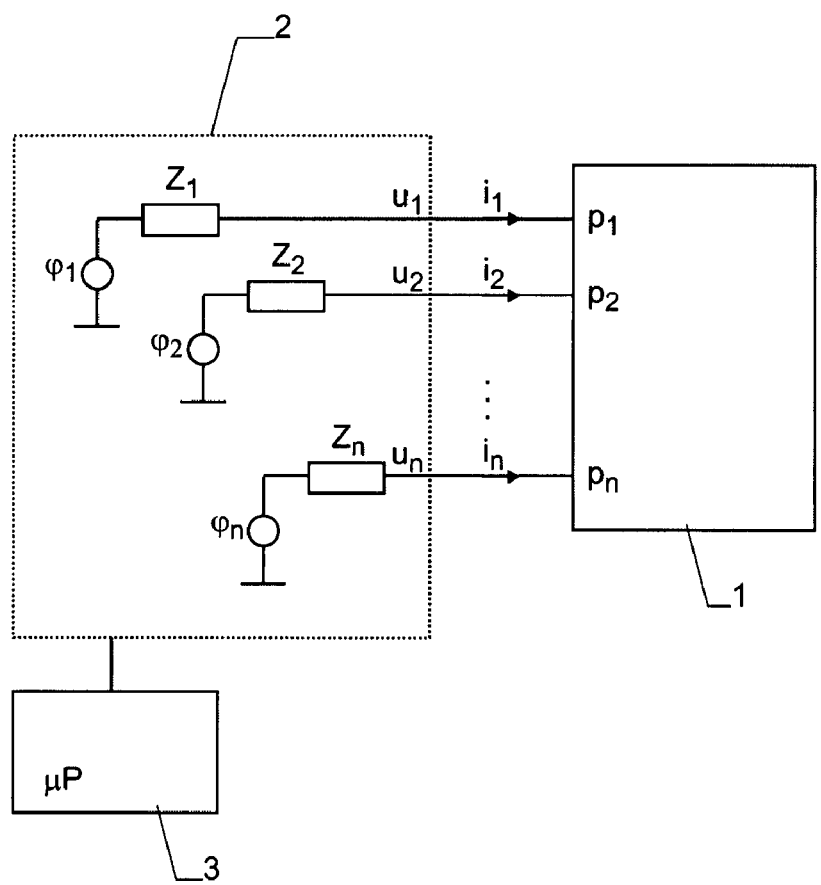
FIG. 2 is a block circuit diagram for a measuring device for characterizing the component.

The Measurement Device:

A general measuring device 2 for carrying out the invention is disclosed in FIG. 2. In a most general case, measuring device 2 comprises n adjustable voltage sources generating voltages $\phi_1$ to $\phi_n$ which are fed to the ports $p_1$ to $p_n$ through impedances $Z_1$ to $Z_n$. The voltages $\phi_1$ to $\phi_n$ all have equal frequency and known phase relationship. The impedances $Z_1$ through $Z_n$ may be practically zero or, as described below, they may be adjustable and potentially non-zero. A control unit 3 is provided for automatically adjusting the voltage sources and, where applicable, the impedances $Z_1$ to $Z_n$.

For the device of FIG. 2 we have $$\phi = u + Z \cdot i, \quad (3)$$

where $\phi=(\phi_1 \ldots \phi_n)$ are the voltages of the voltage sources, $u=(u_1 \ldots u_n)$ the input voltages at the ports, and Z is a diagonal matrix with the diagonal elements $Z_1$ to $Z_n$.

Combining equations (1) and (3) gives the following relationship between the input voltages and the applied voltages:

$$u = (I + Z \cdot Y)^{-1} \cdot \phi. \quad (4)$$

where I is the n×n identity matrix.

As mentioned above, the applied voltages u should correspond to the eigenvectors $v_k$ of the estimated admittance matrix Y'. In general, however, it will not be possible to match this condition exactly because the voltage sources will not be able to generate any arbitrary voltage values but only a discrete set of values. If the number of voltage values that can be generated is small, the impedances $Z_1$ to $Z_n$ can be designed to be adjustable as well in order to obtain a larger number of different input voltages u.

The input voltage vector $u_k$ can be expressed as a linear combination of the eigenvectors $v_1$, i.e.

$$u_k = \sum_{i=1}^{n} \alpha_i v_i. \qquad (5)$$

Combining equations (5), (1) and (2) yields $$i = \sum_{i=1}^{n} \lambda_i \alpha_i v_i. \qquad (5)$$

Hence, to maximize the influence of the k-th eigenvalue on the input current vector i in proportion to the other eigenvalues, the following error function must be minimized $$\frac{\sum_{i=1}^{n} (\lambda_i \alpha_i)^2 - (\lambda_k \alpha_k)^2}{(\lambda_k \alpha_k)^2}. \qquad (6)$$

In other words, for each eigenvalue $\lambda_k$, the coefficients $\alpha_1 \ldots \alpha_n$ must be found (among the set of possible coefficients, which is a finite set due to the discretization inherent to measuring device 2) for which the term of equation (6) is smallest.

If measuring device 2 has adjustable voltage sources and impedances as shown in FIG. 2, we have $$\alpha = [v_1 \ldots v_n]^{-1} \cdot (I + Z \cdot Y)^{-1} \phi. \qquad (7)$$

A measuring device for carrying out the above method should, in general, comprise n voltage generators that are programmable to apply the voltage pattern u to the n ports of device 1. Further, it should comprise n current sensors to measure the currents i. It should be adapted to apply at least n suitable voltage patterns to the ports consecutively for measuring the linear response of the component automatically. This is especially advantageous for components 1 having more than two ports because using this kind of automatic measurement on components with n>2 ports provides substantial gains in speed and accuracy while reducing the costs.

Advantageously, the measuring device should comprise a control unit for carrying out the measurement using the estimation and measurement procedures outlined above.

Figure 3:
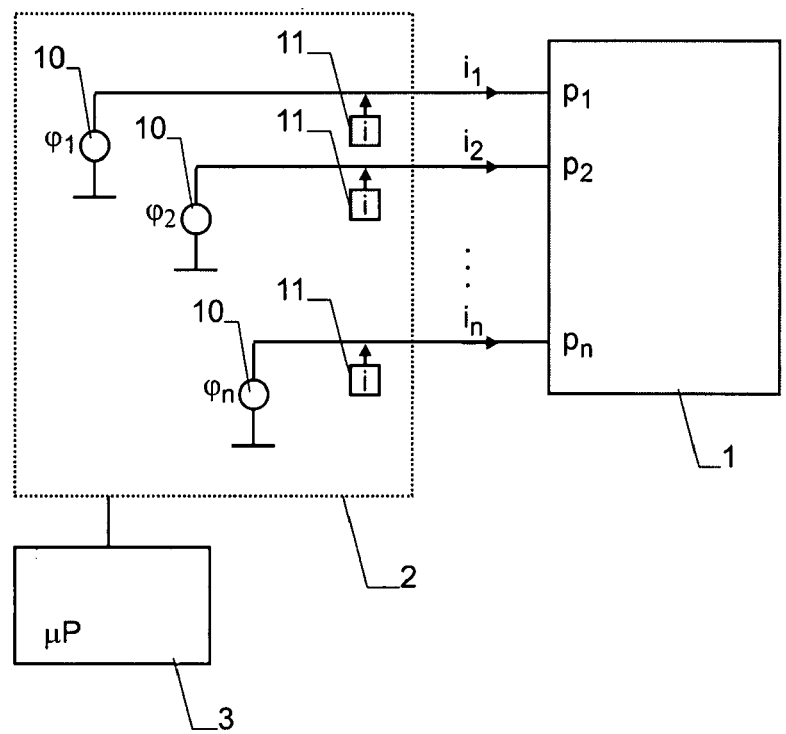
FIG. 3 is a first embodiment of a measuring device.

One possible embodiment of a measuring device 2 is shown in FIG. 3. In this device, a voltage generator 10 for generating an individual voltage $\phi_i$ of adjustable amplitude and phase is provided for each input port. It also comprises n current sensors 11, one for measuring the current to/from each port. Control unit 3 is able to set the applied input voltage directly by controlling the voltage generators 10. If the number of voltage values that can be generated by each voltage generator is small, an optimum voltage for a given eigenvector can be calculated by minimizing the term of equation (6). For each applied voltage pattern, control unit 3 measures the currents i through the ports by means of the current sensors 11.

Figure 4:
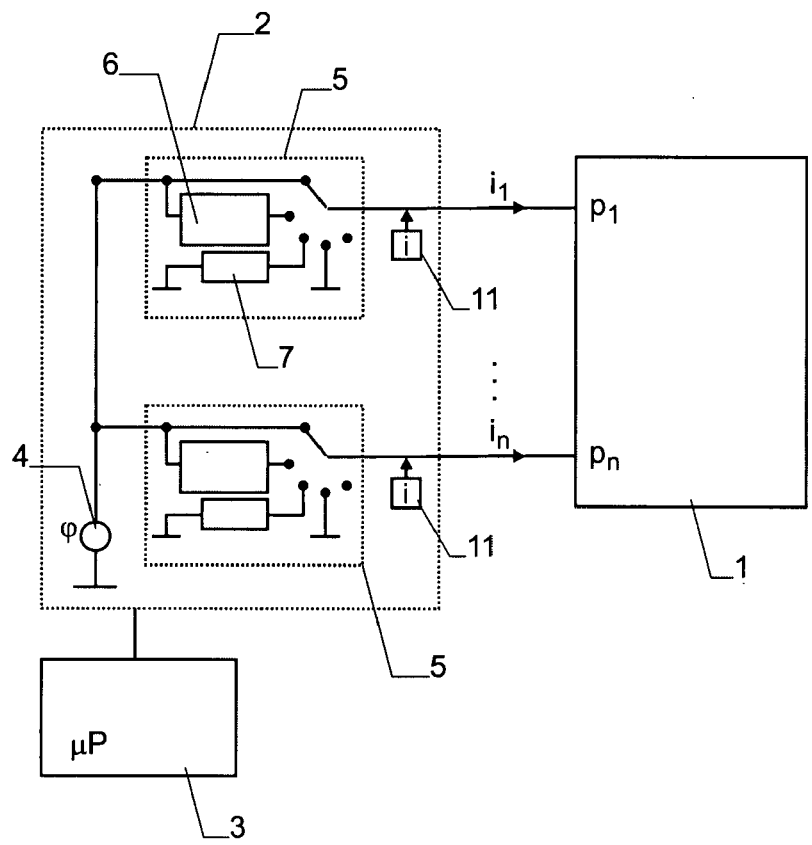
FIG. 4 is a second embodiment of a measuring device.

Another possible embodiment of a measuring device is shown in FIG. 4. This device comprises a single voltage source 4 only. The voltage $\phi$ from the voltage source is fed to n voltage converters 5 controlled by control unit 3, the voltage source and 4 and voltage converters 5 being used instead of the voltage generators 10 of the previous embodiment. Each voltage converter 5 selectively connects one port to either the voltage $\phi$ directly, to the voltage $\phi$ through a damping circuitry 6, to ground via an impedance 7, to ground directly, or leaves the port open (infinite impedance). This measuring circuit has the advantage that it requires a single voltage source only. Suitable settings of the voltage converters for each value can be calculated form equations (6) and (7).

Further Processing of the Results:

As mentioned above, the described measurement procedure yields, for a given frequency, a set of voltage patterns $u_k$ and the corresponding current patterns $i_k$, which fully characterize the linear response of component 1 at the given frequency.

The values $u_k$ and $i_k$ for k=1 . . . n can, in principle, be converted into a more accurate estimate of the admittance matrix Y or the corresponding impedance matrix. However, if the smallest and largest eigenvalues of admittance matrix Y differ by several orders of magnitude, such a matrix is difficult to process numerically with floating point calculations due to rounding errors and limited accuracy of the numerical algorithms. Hence, in an advantageous embodiment of the present invention, the values $u_k$ and $i_k$ are used directly for further processing, without prior conversion to an admittance or impedance matrix Y.

For example, the results of the measurement procedure can e.g. be used for modeling the electrical properties of the component 1 or of a network that component 1 is part of. Such a model can e.g. be used to analyze the stability of the network in general or its response to given events in particular.

The method described here can be used for characterizing a variety of components, such as electrical motors, transformers, switches, transmission lines, etc.

LIST OF REFERENCE NUMERALS 1 component under test
2 measuring device
3 control unit
4 single voltage source
5 voltage converter
6 damping circuit
7 impedance
10 voltage generator
11 current sensor

What is claimed is:

1. A method for characterizing the linear properties of an electrical component having n>1 ports ($p_1, \ldots, p_n$), said method comprising:
   determining, in an estimation procedure, an estimated admittance matrix Y' of said component by applying voltages to said ports ($p_1, \ldots, p_n$) and measuring a response of said component,
   determining eigenvectors $v_k$ of said estimated admittance matrix Y';
   determining voltage patterns $u_k$ corresponding to the determined eigenvectors $v_k$ such that the voltage patterns $u_k$ are substantially proportional to at least one of the determined eigenvectors $v_k$;
   applying, in a measurement procedure, approximately the determined voltage patterns $u_k$ to the ports ($p_1, \ldots, p_n$) of said component; and
   determining, in the measurement procedure, based on each applied voltage pattern $u_k$, a response of said component.

2. The method of claim 1, wherein said measurement procedure comprises the step of measuring, for each voltage pattern $u_k$ applied to said ports ($p_1, \ldots, p_n$), a current pattern $i_k$ at said ports ($p_1, \ldots, p_n$).

3. The method of claim 1, wherein said estimated admittance matrix Y' has n eigenvectors $v_1, \ldots, v_n$ that are determined; and wherein each voltage pattern $u_k$ corresponds to a respective one of the eigenvectors $v_1, \ldots, v_n$.

4. The method of claim 1, wherein said voltage patterns $u_k$ are determined by means of a test device capable of applying a discrete set of different voltage patterns to said ports $(p_1, \ldots, p_n)$, wherein each voltage pattern $u_k$ corresponds to that member of said set that has the property that the term $$\frac{\sum_{i=1}^{n}(\lambda_i\alpha_i)^2 - (\lambda_k\alpha_k)^2}{(\lambda_k\alpha_k)^2}$$

is minimal, wherein $\lambda_1, \ldots, \lambda_n$ are n eigenvalues of the estimated admittance matrix Y' and $$u_k = \sum_{i=1}^{n} \alpha_i v_i$$

with coefficients $\alpha_i$.

5. The method of claim 4 wherein said test device has n voltage generators generating n different voltages $\phi_k$, which voltages $\phi_k$ are applied through n selectable impedances $Z_k$ to said ports $(p_1, \ldots, p_n)$, wherein $$a = [v_1 \ldots v_n]^{-1} \cdot (I + Z \cdot Y)^{-1} \cdot \phi$$

where $\alpha$ is a vector of the coefficients $\alpha_1$ to $\alpha_n$, I is the n×n identity matrix, Z is a diagonal matrix with diagonal elements $Z_k$ and $\phi$ is a vector with elements $\phi_1$ to $\phi_k$.

6. The method of claim 5, wherein a single voltage source and n voltage converters are used as the n voltage generators.

7. The method of claim 1, comprising the steps of repeating said estimation procedure at a plurality of frequencies over a frequency range of interest and carrying out said measurement procedure for at least some of the frequencies.

8. A method for characterizing the linear properties of an electrical component having n>1 ports $(p_1, \ldots, p_n)$, said method including an estimation procedure comprising the step of determining an estimated admittance matrix Y' of said component by applying voltages to said ports $(p_1, p_n)$ and measuring a response of said component;

repeating said estimation procedure at a plurality of frequencies over a frequency range of interest;

said method further comprising:

a measurement procedure comprising the step of applying several voltage patterns $u_k$ to the ports $(p_1, \ldots, p_n)$ of said component, each voltage pattern $u_k$ corresponding to an eigenvector $v_k$ of said estimated admittance matrix Y', and determining, for each applied voltage pattern $u_k$, a response of said component; and carrying out said measurement procedure for at least some of the frequencies, wherein said measurement procedure is carried out for frequencies where an absolute ratio between maximum and a minimum eigenvalue of said estimated admittance matrix Y' has a local maximum or exceeds a given threshold.

9. A method for characterizing the linear properties of an electrical component having n>1 ports $(p_1, \ldots, p_n)$, said method including an estimation procedure comprising the step of determining an estimated admittance matrix Y' of said component by applying voltages to said ports $(p_1, \ldots, p_n)$ and measuring a response of said component;

repeating said estimation procedure at a plurality of frequencies over a frequency range of interest;

said method further comprising:

a measurement procedure comprising the step of applying several voltage patterns $u_k$ to the ports $(p_1, \ldots, p_n)$ of said component, each voltage pattern $u_k$ corresponding to an eigenvector $v_k$ of said estimated admittance matrix Y', and determining, for each applied voltage pattern $u_k$, a response of said component;

carrying out said measurement procedure for at least some of the frequencies; and determining critical frequencies, wherein a density of measurements close to said critical frequencies is larger than a number of measurements away from said critical frequencies.

10. The method of claim 9, wherein the desired frequency range is divided in a number of frequency windows and the most critical frequencies are calculated in each frequency window.

11. The method of claim 2, wherein the applied voltage patterns $u_k$ and the current patterns $i_k$ are used directly for further processing, without prior conversion to an admittance matrix Y or impedance matrix Z.

12. The method of claim 1, wherein the component is an electrical motor, a transformer, a switch, or a transmission line.

13. A method for modeling an electrical system with at least one component comprising the steps of characterizing the component using the method of claim 1 by determining the applied voltage patterns $u_k$ and, for each voltage pattern $u_k$ applied to said ports $(p_1, \ldots, p_n)$, a current pattern $i_k$ at said ports $(p_1, \ldots, p_n)$, and modeling said system using said voltage patterns $u_k$ and said current patterns $i_k$ without calculating an admittance or impedance matrix of said component.

14. The method of claim 13, wherein the model is used to analyze the stability of a network that component is part of.

15. A device for characterizing the linear properties of an electrical component having n>1 ports $(p_1, \ldots, p_n)$, said device comprising n voltage generators for generating a voltage for each port $(p_1, \ldots, p_n)$, n current sensors for sensing the current at each port $(p_1, \ldots, p_n)$, and a control unit configured to characterize the linear properties of the electrical component having the n>1 ports $(p_1, \ldots, p_n)$ by determining, in an estimation procedure, an estimated admittance matrix Y' of said component by applying voltages to said ports $(p_1, \ldots, p_n)$ and measuring a response of said component, determining eigenvectors $v_k$ of said estimated admittance matrix Y';

determining voltage patterns $u_k$ corresponding to the determined eigenvectors $v_k$ such that the voltage patterns $u_k$ are substantially proportional to at least one of the determined eigenvectors $v_k$;

applying, in a measurement procedure, approximately the determined voltage patterns $u_k$ to the ports $(p_1 \ldots p_n)$ of said component; and determining, in the measurement procedure, based on each applied voltage pattern $u_k$, a response of said component.

16. The device of claim 15, wherein a single voltage source and n voltage converters are used as the n voltage generators.

17. The device of claim 15, having n>2 ports ($p_1, \ldots, p_n$) wherein the control unit automatically generates the voltage patterns $u_k$ at said ports ($p_1, \ldots, p_n$) and measures the corresponding currents $i_k$ at said ports ($p_1, \ldots, p_n$) and derives the linear response of said component therefrom.

18. The device of claim 15, wherein said control unit is configured to apply at least n different voltage patterns $u_k$ to said ports ($p_1, \ldots, p_n$) consecutively.

19. The device of claim 16, having n>2 ports ($p_1, \ldots, p_n$) wherein the control unit automatically applies the voltage patterns $u_k$ at said ports ($p_1, \ldots, p_n$) and measures the corresponding currents $i_k$ at said ports ($p_1, \ldots, p_n$) and derives the linear response of said component therefrom.

20. The device of claim 17, wherein said control unit is configured to apply at least n different voltage patterns $u_k$ to said ports ($p_1, \ldots, p_n$) consecutively.

* * * * *